United States Patent
Banwait et al.

(10) Patent No.: US 7,397,401 B2
(45) Date of Patent: Jul. 8, 2008

(54) ARITHMETIC DECODE WITHOUT RENORMALIZATION COSTS

(75) Inventors: Harminder S. Banwait, Waterloo (CA); Eric C. Pearson, Conestogo (CA); Scott F. James, Waterloo (CA)

(73) Assignee: LSI Logic Corporation, Milpitas, CA (US)

(*) Notice: Subject to any disclaimer, the term of this patent is extended or adjusted under 35 U.S.C. 154(b) by 1 day.

(21) Appl. No.: 11/483,056

(22) Filed: Jul. 7, 2006

(65) Prior Publication Data

US 2008/0007436 A1    Jan. 10, 2008

(51) Int. Cl.
*H03M 7/00* (2006.01)
(52) U.S. Cl. ................................ 341/107; 382/238
(58) Field of Classification Search .............. 341/107, 341/51, 50, 59, 106; 714/786; 382/238
See application file for complete search history.

(56) References Cited

U.S. PATENT DOCUMENTS 6,025,932 A * 2/2000 Imanaka .................. 382/238
7,183,951 B2 * 2/2007 Bossen .................... 341/107

* cited by examiner

*Primary Examiner*—Rexford Barnie
*Assistant Examiner*—Joseph Lauture
(74) *Attorney, Agent, or Firm*—Christopher P. Maiorana, P.C.

(57) ABSTRACT

An apparatus comprising a first circuit and a second circuit. The first circuit may be configured to generate context information in response to one or more bins on a binary signal. The second circuit may be configured to generate the binary signal in response to (i) one or more input bits on a bitstream signal, and (ii) simultaneously performing in a single cycle (a) an arithmetic decode of the context information and (b) a renormalization of the context information.

18 Claims, 5 Drawing Sheets

ARITHMETIC DECODE WITHOUT RENORMALIZATION COSTS

FIELD OF THE INVENTION

The present invention relates to digital video generally and, more particularly, to a method and/or apparatus for implementing an arithmetic decode without renormalization costs.

BACKGROUND OF THE INVENTION

The H.264 video codec system includes, as part of the main profile, a context adaptive binary arithmetic-coding (CABAC) program. While decoding input bits from an encoded bitstream, all contexts need to go through renormalization. The renormalization process needs a comparison operation, a shift operation, and an ADD operation to be performed 0 to 6 times. Each comparison operation, shift operation and 'OR' operation consumes 0 to 6 input bits. The renormalization operation performed on contexts are needed to decode the output binary symbol (bin). Contexts that need 0 or 1 input bits can perform a renormalization operation in the same cycle. However, when more than one bit is needed, additional cycles are needed.

Conventional methods use one cycle every time an input bit is consumed. Such consumption needs a maximum of 5 cycles to perform renormalization. The additional cycles used to perform renormalization takes away from decoding operation time and degrades the performance of an arithmetic decoder.

SUMMARY OF THE INVENTION

The present invention concerns an apparatus comprising a first circuit and a second circuit. The first circuit may be configured to generate context information in response to one or more bins on a binary signal. The second circuit may be configured to generate the binary signal in response to (i) one or more input bits on a bitstream signal and (ii) simultaneously performing in a single cycle, (a) an arithmetic decode of the context information and (b) a renormalization of the context information.

The objects, features and advantages of the present invention include providing an arithmetic decode without renormalization costs that may (i) decode one bin per cycle, (ii) be implemented without additional hardware, (iii) be inexpensive to implement and/or (iv) be easy to implement.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
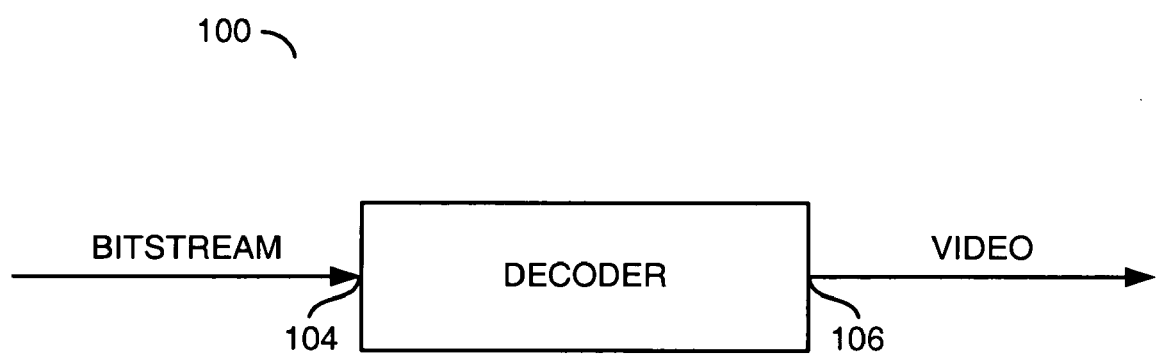
FIG. 1 is a diagram of a decoder incorporating the present invention.

Referring to FIG. 1, a diagram of a block (or circuit) 100 is shown in accordance with a preferred embodiment of the present invention. In one example, the circuit 100 may be implemented as a decoder. The decoder 100 may have an input 104 that may receive a signal (e.g., BITSTREAM) and an output 106 that may present a signal (e.g., VIDEO). The decoder 100 may generate a decoded video sequence on the signal VIDEO in response to arithmetically decoding bit stream data from the signal BITSTREAM.

Figure 2:
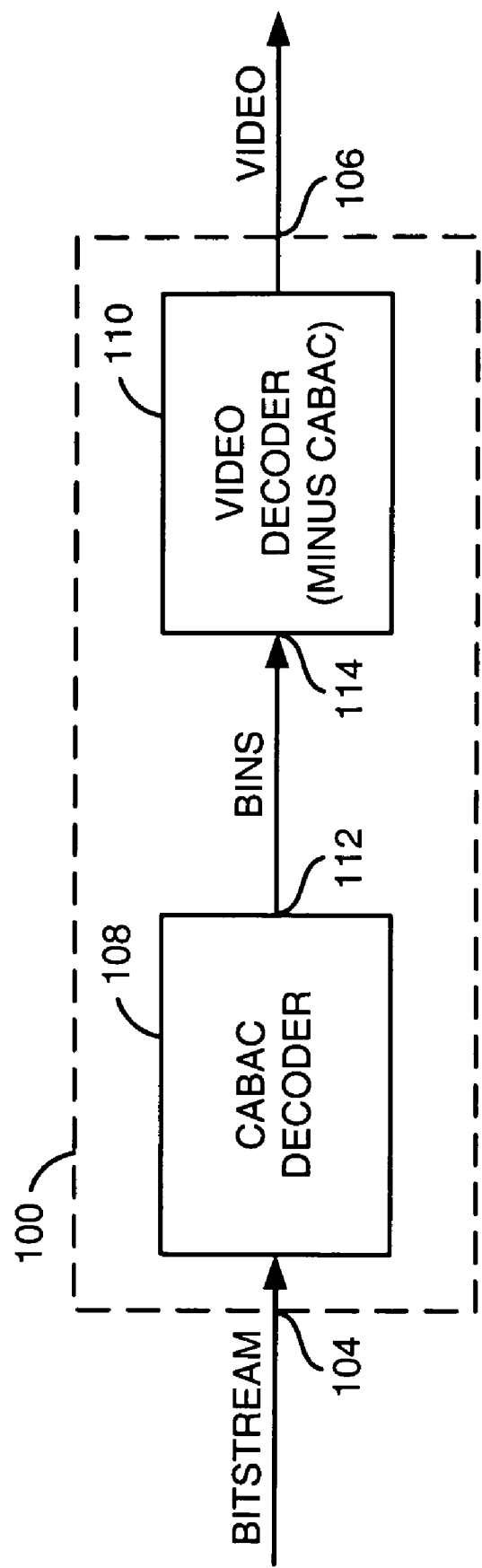
FIG. 2 is a more detailed diagram of the decoder incorporating the present invention.

Referring to FIG. 2, a more detailed block diagram of the decoder 100 is shown. The decoder 100 is shown generally comprising a block (or circuit) 108 and a block (or circuit) 110. In one example, the circuit 108 may be implemented as a decoder and the circuit 110 may be implemented as a decoder. In one example, the decoder 108 may be implemented as a CABAC decoder. In one example, the decoder 110 may be implemented as a video decoder, but without the CABAC functions. The decoder 108 may have an output 112 that presents a signal (e.g., BINS) to an input 114 of the decoder 110. The CABAC decoder 108 may generate bins (or binary information) over the signal BINS in response to arithmetically decoding bit stream data from the signal BITSTREAM. The video decoder 110 may decode the signal BINS to generate a decoded video sequence.

Figure 3:
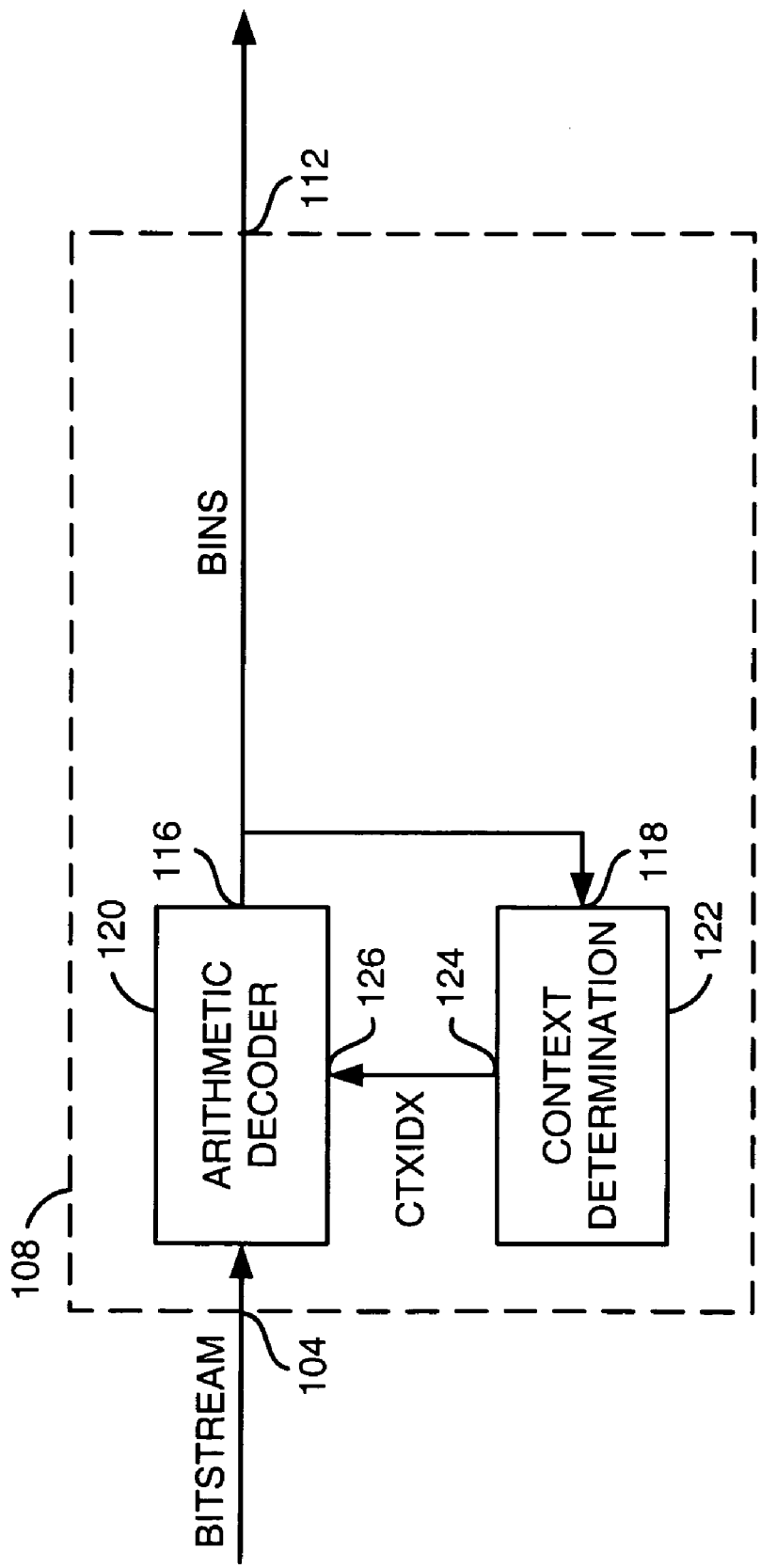
FIG. 3 is a detailed diagram of a CABAC decoder in accordance with the present invention.

Referring to FIG. 3, a more detailed block diagram of the decoder 108 is shown. The decoder 108 generally comprises a block (or circuit) 120 and a block (or circuit) 122. The circuit 120 may be implemented as a arithmetic decoder. The circuit 122 may be implemented as a context determination block. The circuit 120 may have an output 116 that may present the signal BINS. The circuit 122 may have an input 118 that may receive the signal BINS. The circuit 122 may have an output 124 that may present a signal (e.g., CTXIDX) to an input 126 of the circuit 120. The arithmetic decoder 120 may generate binary symbols on the signal BINS in response to context information received from the signal CTXIDX and encoded bit stream data received from the signal BITSTREAM. Contexts (or context information) may be needed to produce each output bin.

Figure 4:
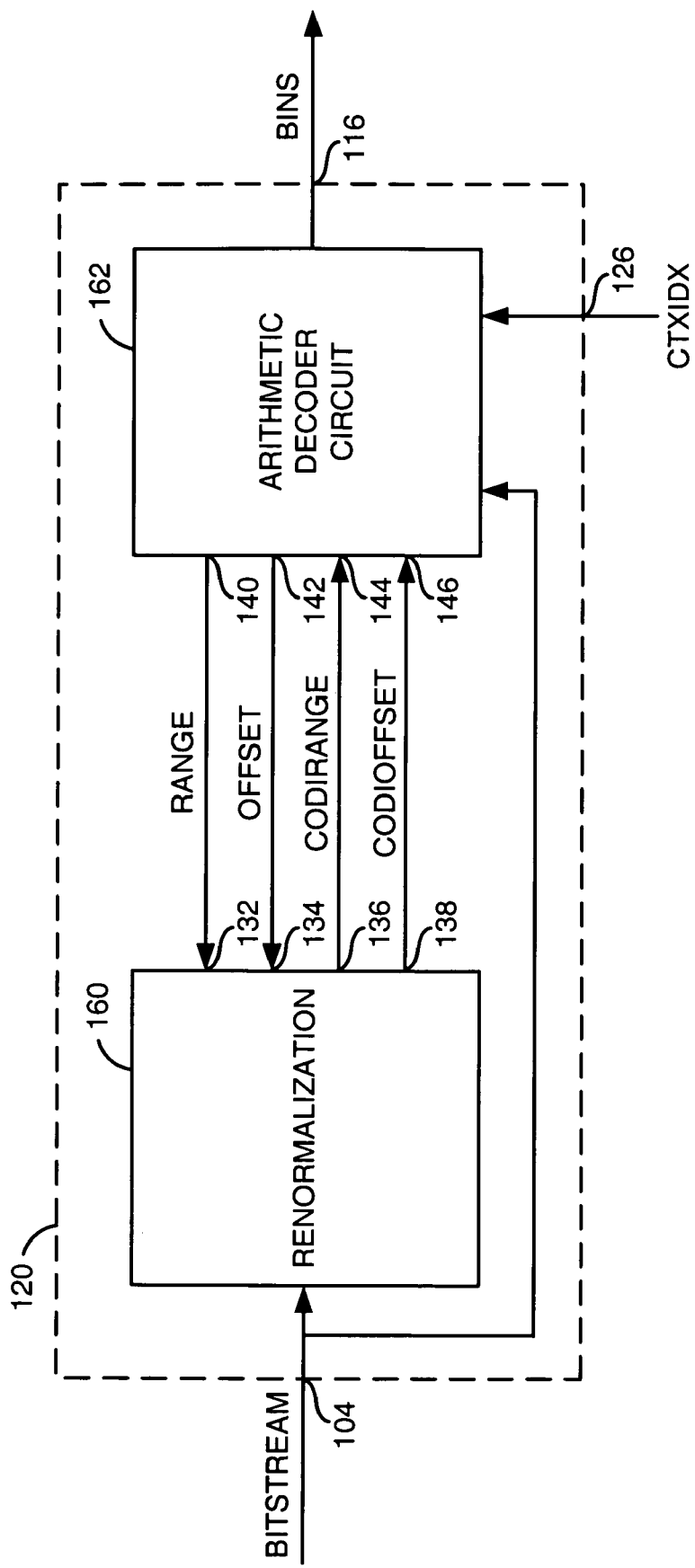
FIG. 4 is a detailed diagram of an arithmetic decoder in accordance with the present invention.

Referring to FIG. 4, a more detailed diagram of the arithmetic decoder 120 is shown. The arithmetic decoder 120 generally comprises a block (or circuit) 160, a block (or circuit) 162. The circuit 160 may be implemented as a renormalization circuit. The circuit 162 may be implemented as an arithmetic decoder circuit. The circuit 160 may have an input 132 that may receive a signal (e.g., RANGE), an input 134 that may receive a signal (e.g., OFFSET), an output 136 that may present a signal (e.g., CODIRANGE), and an output 138 that may present a signal (e.g., CODIOFFSET). The circuit 162 may have an output 140 that may present the signal RANGE, an output 142 that may present the signal OFFSET, an input 144 that may receive the signal CODIRANGE, and an input 146 that may receive the signal CODIOFFSET. The arithmetic decoder circuit 120 may perform arithmetic decoding on contexts to generate the signal BINS. The arithmetic decoder circuit 120 may perform arithmetic decoding on contexts that need to be passed through the renormalization process.

For an arithmetic coded syntax element parsed from the signal BITSTREAM, the signal CTXIDX may include single or multiple contexts. The contexts may be arithmetically decoded by the arithmetic decoder circuit 162 as defined in the H.264 standard (or JVT-050 H.264/AVC Standard, JVT-050 or more recently: ITU-T Rec H.264|ISO/IEC 14496-10 and all amendments, Current Revisions H.264(E)). In general, all contexts need to be passed through the renormalization process as specified by the H.264 standard. While the renormalization circuit 160 performs renormalization on a context, the arithmetic decoder circuit 162 may calculate a range value. The arithmetic decoder circuit 162 may present range values for the context on the signal RANGE. The range value may indicate the number of iterations needed to perform renormalization on any given context. By determining the number of iterations needed to perform renormalization on context, the arithmetic decoder 120 may comply with the H.264 standard.

The renormalization circuit 160 may multiply the range value by a first value to produce an updated range value. The first value may be defined by the H.264 standard. If the updated range value is not equal to (or greater than) a predetermined range value, the renormalization circuit 160 may present the updated range value back to the arithmetic decoder circuit 162 over the signal CODIRANGE. The predetermined range value may be defined by the H.264 standard. The arithmetic decoder circuit 162 may (i) calculate a new range value based on the updated range value on the signal CODIRANGE along with the next context and (ii) present the new range value back to the renormalization circuit 160. By calculating the new range value based on the updated range value and the next context, the arithmetic decoder 120 may comply with the H.264 standard.

The renormalization circuit 160 may compare the new range value to the predetermined range value to determine if the new range value is greater than (or equal to) the predetermined range value. If the new range value is greater than (or equal to) the predetermined range value, the renormalization circuit 100 may discontinue multiplying the new range value by the first value. In one example, the renormalization circuit 160 may multiply the range value by 2 (e.g., the first value) until the updated range value is equal to (or greater than) 0×100 hexadecimal (e.g., the predetermined range value). If the updated range value is equal to (or greater than) 0×100 hexadecimal, then (i) no renormalization is performed on the context, (ii) the signal CODIRANGE may be assigned the range value, and (iii) the offset value may be assigned to the signal CODIOFFSET. If the updated range value is less than 0×100 hexadecimal, the arithmetic decoder 120 may continue to pass context through the renormalization process (e.g., or renormalization loop). While in the renormalization loop, the updated range value may be doubled and compared to 0×100 hexadecimal. The result may be doubled until the updated range value is equal to (or greater than) 0×100 hexadecimal. When the updated range value is equal to (or greater than) 0×100 hexadecimal, the arithmetic decoder 120 may exit out of the renormalization loop. The particular value selected for the first value and the predetermined range value may be varied to meet the design criteria of a particular implementation.

The arithmetic decoder circuit 162 may calculate an offset value for all contexts when contexts are passed through the renormalization loop. By calculating the offset value for contexts, the arithmetic decoder 120 may comply with the H.264 standard. The arithmetic decoder circuit 162 may present an offset value for the context on the signal OFFSET. The renormalization circuit 160 may multiply the offset value calculated for the context by a second value. The second value may be defined by the H.264 standard. The particular value selected for the second value may be varied to meet the design criteria of a particular implementation. In one example, the renormalization circuit 160 may multiply the offset value by two (e.g., the second value). The renormalization circuit 160 may (i) add the multiplied offset value to a predetermined number of input bits received on the signal BITSTREAM and (ii) produce a final offset value. After the offset value is multiplied by two, a single bit may be added from the signal BITSTREAM. The operation on the offset value may be performed the same number of times the operations are performed on the updated range value. If the updated range value is equal to (or greater than) 0×100 hexadecimal, the arithmetic decoder 120 may exit out of the renormalization loop, and the corresponding offset value may be presented on the signal CODIOFFSET. The renormalization circuit 160 may shift bits on the signal BITSTREAM based on the number of input bits used while performing renormalization on the context. The arithmetic decoder circuit 162 may perform arithmetic decoding on context while the renormalization circuit 160 performs renormalization on the context.

In general, the arithmetic decoder 120 may simultaneously perform (i) arithmetic decoding on context and (ii) renormalization of the context in the same cycle. By performing renormalization and decoding on the context within the same cycle, the arithmetic decoder 120 may maintain an optimal throughput of bin/cycle. The renormalization circuit 160 may determine the number of iterations used while performing renormalization on the context. The renormalization circuit 160 may determine the number of iterations in order to determine how many bits to advance for the arithmetic decoder circuit 162 to decode the next context.

Figure 5:
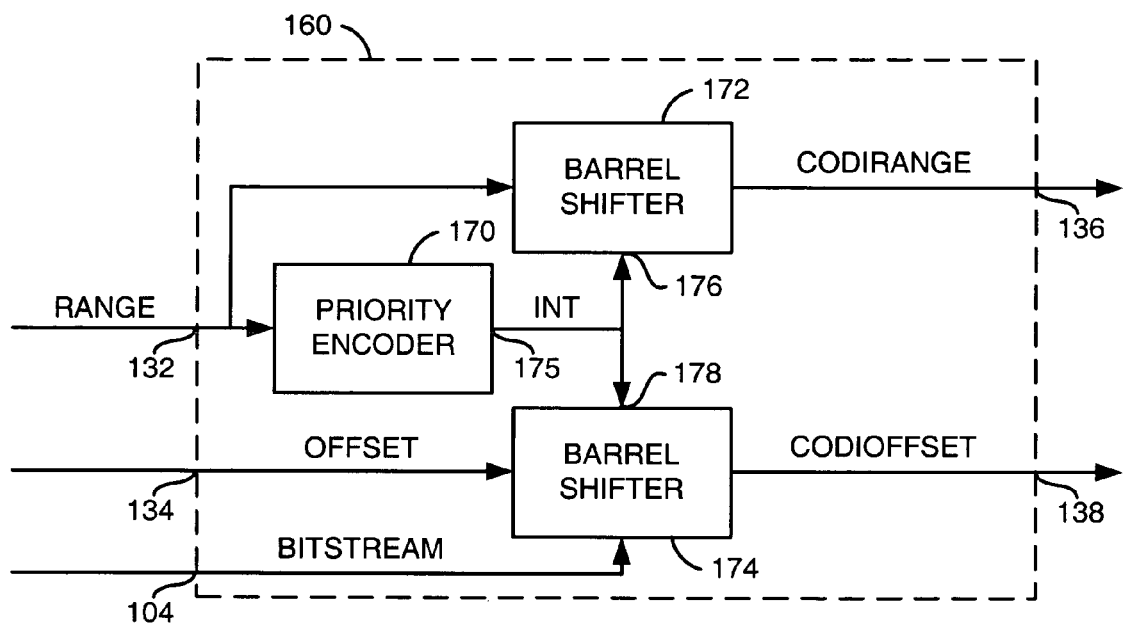
FIG. 5 is a detailed diagram of a renormalization unit in accordance with the present invention.

Referring to FIG. 5, a more detailed diagram of the renormalization unit is shown. The renormalization circuit 160 generally comprises a block (or circuit) 170, a block (or circuit) 172 and a block (or circuit) 174. The circuit 170 may be implemented as a priority encoder. The circuit 172 may be implemented as a barrel shifter. The circuit 174 may be implemented as a barrel shifter. The priority encoder circuit 170 may have an output 175 that may generate a signal (e.g., INT) in response to the signal RANGE. The barrel shifter 172 may have an input 176 that may receive the signal INT. The barrel shifter 174 may have an input 178 that may receive the signal INT.

The priority encoder 170 may indicate on the signal INT how many shift operations to perform. The priority encoder 170 may present the number of shift operations to the barrel shifter 172 and the barrel shifter 174. In one example, the priority encoder 170 may determine the number of shift operations based on the signal RANGE. The number of shift operations to be performed may be based on the following conditions:

If (RANGE[8]=1)
    INT=0
Else If (RANGE[7]=1)
    INT=1
Else If (RANGE[6]=1)
    INT=2
Else If (RANGE[5]=1)
    INT=3
Else If (RANGE[4]=1)
    INT=4
Else If (RANGE[3]=1)
    INT=5
Else INT=6

The signal RANGE may include nine bits from 0 to 8. The signal RANGE[8] may represent the $8^{th}$ bit from the signal RANGE[8:0]. Bit 8 may be the most significant bit and bit 0 may be the least significant bit. In one example, if the signal RANGE[8] is set, the signal INT may be set to 0. The signal INT may indicate that the barrel shifter 172 and the barrel shifter 174 may perform 0 shift operations. In one example, if the signal RANGE[2] is set, the signal INT may be set to 6. The signal INT may indicate that the barrel shifter 172 and the barrel shifter 174 may perform 6 shift operations.

The barrel shifter 172 may present the signal CODIRANGE in response to the signal INT. The signal CODIRANGE may indicate that the 0×100 hexadecimal (e.g., the predetermined range value) has been achieved. If the range value on the signal RANGE is less than or equal to the 0×100 hexadecimal, the range value may be presented to the barrel shifter 172. The barrel shifter 172 may multiply the range value by two (e.g., the first value) and present the updated range value to the arithmetic decoder circuit 162 over the signal CODIRANGE.

The barrel shifter 174 may receive (i) offset values on the signal OFFSET and (ii) input bits on the signal BITSTREAM. The barrel shifter 174 may (i) multiply the offset value by two (e.g., the second value) and (ii) add the result to the input bits. The barrel shifter 174 may also receive the signal INT to indicate the number of shifts (or multiplication and/or ADD iterations) to be performed.

In one example, the present invention may provide the signals RANGE and OFFSET to a central processing unit (CPU) or a digital signal processor (DSP). The CPU and DSP may be equipped with a priority encoder and barrel shifters. The priority encoder and the barrel shifter may be configured to perform renormalization on all contexts. An alternative software implementation may perform the renormalization function. The CPU/DSP and software may perform the renormalization function in fewer cycles than conventional methods.

The present invention provides an arithmetic decode operation which is proportional to the number of outputs bins. Such an arithmetic decode operation may be achieved by (i) performing the renormalization of contexts once per bin and (ii) reading an arbitrary number of input bits while performing the renormalization of contexts once per bin.

Detection of infringement of the present invention may be detected via VLSI technology (e.g., 0.13μ) and a data sheet specification of H.264 level (e.g., L4.1). In general, bitstreams may be constructed to test extremes of the bin/bit ratio. With such a construction, the detection of various lags may be achieved where the limits of hardware are reached. In one example, BluRay may need 4 slices/picture with a maximum slice size being half a picture. Constructed tests may be developed to allocate all bits and bins to a half picture slice by performing skips in all of the slices. If the hardware can handle a process with a complexity of one bin/cycle, infringement of the present invention may be inferred.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first circuit configured to generate context information in response to one or more bins on a binary signal; and
   a second circuit configured to generate said binary signal in response to (i) one or more input bits on a bitstream signal and (ii) simultaneously performing in a single cycle, (a) an arithmetic decode of said context information and (b) a renormalization of said context information, wherein said second circuit is further configured to (i) perform said renormalization once per bin and (ii) read a predetermined number of said input bits while performing said renormalization once per bin.

2. The apparatus according to claim 1, wherein said second circuit comprises a renormalization circuit configured to (i) perform said renormalization and (ii) read said predetermined number of input bits on said bitstream signal.

3. The apparatus according to claim 2, wherein said second circuit comprises an arithmetic decoder circuit configured to calculate and present a range value to said renormalization circuit.

4. The apparatus according to claim 3, wherein said renormalization circuit is configured to compare said range value to a predetermined range value.

5. The apparatus according to claim 4, wherein said renormalization circuit is configured to multiply said range value with a first value to produce an update range value if said range value is less than said predetermined range value.

6. The apparatus according to claim 4, wherein said renormalization circuit presents said updated range value to said arithmetic decoder circuit until said updated range value is greater than or equal to a predetermined range value.

7. The apparatus according to claim 5, wherein said renormalization circuit is configured to multiply an offset value with a second value to produce a multiplied offset value.

8. The apparatus according to claim 3, wherein said range value indicates the number of iterations needed to perform renormalization on said context information.

9. The apparatus according to claim 1, wherein said apparatus is implemented as a context adaptive binary arithmetic-coding decoder.

10. The apparatus according to claim 2, wherein said renormalization circuit further comprises:
    one or more barrel shifters configured to perform shift operations; and
    a priority encoder configured to determine the number of shift operations to be performed by said one or more barrel shifters.

11. An apparatus comprising:
    means for generating context information in response to one or more bins on a binary signal; and
    means for generating said binary signal in response to (i) one or more input bits on a bitstream signal and (ii) simultaneously performing in a single cycle, (a) an arithmetic decode of said context information and (b) a renormalization of said context information, wherein said means for generating said binary signal is further configured to (i) perform said renormalization once per bin and (ii) read a predetermined number of said input bits while performing said renormalization once per bin.

12. A method for context adaptive binary arithmetic decoding comprising the steps of:
    (a) generating context information in response to one or more bins on a binary signal; and
    (b) generating said binary signal in response to (i) one or more input bits on a bitstream signal and (ii) simultaneously performing in a single cycle, (a) an arithmetic decode of said context information and (b) a renormalization of said context information, wherein step (b) includes the sub-steps of (i) performing said renormalization once per bin and (ii) reading a predetermined number of said input bits while performing said renormalization once per bin.

13. The method according to claim 12, further comprising the step of:

calculating a range value.

14. The method according to claim 13, further comprising the step of:

comparing said range value to a predetermined range value.

15. The method according to claim 14, further comprising the step of:

multiplying said range value with a first value to produce an update range value if said range value is less than said predetermined range value.

16. The method according to claim 15, further comprising the step of:

presenting said updated range value until said updated range value is greater than or equal to a predetermined range value.

17. The method according to claim 16, further comprising the step of:

multiplying an offset value with a second value to produce a multiplied offset value.

18. The method according to claim 13, wherein said range value indicates the number of iterations needed to perform renormalization on said context information.

* * * * *